(12) United States Patent
Kato

(10) Patent No.: US 10,111,370 B2
(45) Date of Patent: Oct. 23, 2018

(54) WORK MACHINE

(71) Applicant: FUJI CORPORATION, Chiryu (JP)

(72) Inventor: Masaki Kato, Toyota (JP)

(73) Assignee: FUJI CORPORATION, Chiryu (JP)

( * ) Notice: Subject to any disclaimer, the term of this patent is extended or adjusted under 35 U.S.C. 154(b) by 231 days.

(21) Appl. No.: 14/906,858

(22) PCT Filed: Jul. 23, 2013

(86) PCT No.: PCT/JP2013/069877
§ 371 (c)(1),
(2) Date: Jan. 21, 2016

(87) PCT Pub. No.: WO2015/011779
PCT Pub. Date: Jan. 29, 2015

(65) Prior Publication Data
US 2016/0165770 A1 Jun. 9, 2016

(51) Int. Cl.
*B23P 19/00* (2006.01)
*H05K 13/04* (2006.01)
*H05K 13/08* (2006.01)

(52) U.S. Cl.
CPC ......... *H05K 13/0404* (2013.01); *H05K 13/08* (2013.01); *Y10T 29/53174* (2015.01)

(58) Field of Classification Search
CPC .............. H05K 13/0404; H05K 13/08; H05K 13/0482; G01R 1/04; B65G 47/26;
(Continued)

(56) References Cited

U.S. PATENT DOCUMENTS 5,177,434 A * 1/1993 Suzuki ............. G01R 1/04
198/468.3
5,639,203 A * 6/1997 Lee ............. H05K 13/0482
414/749.5
(Continued)

FOREIGN PATENT DOCUMENTS

EP 0 808 091 A1 11/1997
JP 2000-114787 A 4/2000
(Continued)

OTHER PUBLICATIONS

European Supplementary Search Report dated Feb. 10, 2017 in Patent Application No. 13 88 9919.0.
(Continued)

*Primary Examiner* — Donghai D Nguyen
(74) *Attorney, Agent, or Firm* — Oblon, McClelland, Maier & Neustadt, L.L.P.

(57) ABSTRACT

A work machine provided with slider that moves in a specified direction, and two mounting heads and attached to the slider is provided. The slider has holding, and first and second attachment sections to which a mounting head is attached. The first attachment section is provided on the holding plate, and the second attachment section is provided on the holding plate so as to be changeable between any distance which is a distance between the first and second attachment sections. Accordingly, it is possible to change the distance between attachment sections and two wide work heads may be mounted on the slider. In a case in which the types of the two work heads are not to be changed, it is possible to change the spacing between the two work heads. By changing the spacing between the two work heads, interference between the work heads may be prevented.

6 Claims, 12 Drawing Sheets

(58) Field of Classification Search
CPC ........... Y10T 29/4913; Y10T 29/49131; Y10T 29/53039; Y10T 29/5313; Y10T 29/53174
USPC ............... 29/832, 833, 709, 739; 198/468.3; 294/87.1; 414/749.5
See application file for complete search history.

(56) References Cited

U.S. PATENT DOCUMENTS

| | | |
|---|---|---|
| 5,806,174 A | 9/1998 | Itoh |
| 5,839,769 A * | 11/1998 | Slocum ................. B65G 47/26 294/87.1 |
| 2008/0296315 A1 | 12/2008 | Read |

FOREIGN PATENT DOCUMENTS

| | | |
|---|---|---|
| JP | 2002-132310 A | 5/2002 |
| JP | 2002-176291 A | 6/2002 |
| JP | 2007-329347 A | 12/2007 |
| JP | 2012-205364 A | 10/2012 |

OTHER PUBLICATIONS

International Search Report dated Oct. 1, 2013, in PCT/JP2013/069877 Filed Jul. 23, 2013.

* cited by examiner

X-axis direction

|  | First proximity sensor | Second proximity sensor | Third proximity sensor | Fourth proximity sensor |
|---|---|---|---|---|
| Distance between attachment sections B | ON | ON | - | - |
| Distance between attachment sections B+A | ON | - | ON | - |
| Distance between attachment sections B+2×A | - | ON | - | ON |
| Distance between attachment sections B+3×A | - | ON | ON | - |
| Distance between attachment sections B+4×A | - | - | ON | ON |

|  | Fifth proximity sensor | Sixth proximity sensor | Seventh proximity sensor |
|---|---|---|---|
| Distance between attachment sections B | ON | - | - |
| Distance between attachment sections B+A | ON | ON | - |
| Distance between attachment sections B+2×A | - | ON | - |
| Distance between attachment sections B+3×A | - | ON | ON |
| Distance between attachment sections B+4×A | - | - | ON |

WORK MACHINE

TECHNICAL FIELD

The present disclosure relates to a work machine provided with a slider held on a holding section as to be movable in a specified direction, and two work heads detachably attached to the slider.

BACKGROUND ART

Many work machines, as disclosed in the patent literature below, are provided with a slider held on a holding section as to be movable in a specified direction, and a work head detachably attached to the slider such that a relatively wide range of work can be performed by the work head. Further, in recent years, to support the diversification of work and so on, development has progressed of work machines in which two work heads are attached to a slider.

Patent Literature 1: JP-A-2002-132310

SUMMARY

With a work machine with a slider to which two work heads are attached, it is possible to enable various work, which is useful. Also, usually, work heads are detachable from the slider, so an even greater range of work can be enabled by exchanging work heads that are attached to the slider. However, the dimensions of a work head differ between each work head, and if two wide work heads are attempted to be attached to a slider, there are cases in which interference occurs between the heads, and the two work heads cannot be attached to the slider. The present disclosure takes account of the above circumstances, and an object thereof is to provide an attachment section spacing distance detector capable of preventing interference between two work heads that are attached to a slider.

In order to solve the above problem, the work machine according to an aspect of the disclosure comprises: a slider that is held on a holding section so as to be movable in a specified direction; and two work heads that are detachably attached to the slider; wherein the slider has a main body, a first attachment section that is provided on the main body and to which one of the two work heads is attached, and a second attachment section that is provided on the main body at a set distance from the first attachment section so as to be changeable between any one of multiple of the set distances that are set in advance, and to which the other of the two work heads is attached.

Also, the work machine according to another aspect further comprises: multiple detected sections provided on one of the main body and the second attachment section; and an attachment section spacing distance detector that is provided on the other one of the main body and the second attachment section, has multiple sensors which detect the multiple detected sections, and detects the distance between the first attachment section and the second attachment section by the detection of at least one of the multiple detected sections by two of the sensors out of the multiple sensors.

Also, the work machine according to another aspect is an aspect in which the quantity of the multiple sensors is smaller than the quantity of the multiple set distances.

Also, the work machine according to another aspect is an aspect in which the multiple detected sections are provided on one of the main body and the second attachment section spaced at a distance extending in the specified direction; the multiple sensors are provided on the other one of the main body and the second attachment section spaced at a distance extending in the specified direction; and the attachment section spacing distance detector detects the distance between the first attachment section and the second attachment section by the detection of the multiple detected sections by two sensors which are not adjacent to each other among the multiple sensors, or by the detection of at least one of the multiple detected sections by two sensors which are adjacent to each other among the multiple sensors.

Also, the work machine according to another aspect further comprises: a moving device that moves the slider in the specified direction; a control device that controls operation of the moving device; a stopper that limits the movement of the slider in the specified direction by being contacted by the stopper; wherein the stopper changes the movement amount of the slider in the specified direction based on the distance between the first attachment section and the second attachment section; and wherein the control device has a storage section that stores the movement amount of the slider in the specified direction based on the distance between the first attachment section and the second attachment section, a movement control section that acquires from the storage section the movement amount of the slider based on the distance between the first attachment section and the second attachment section that was detected by the attachment section spacing distance detector, and moves the slider towards the stroke end of the acquired movement amount of the slider, and a determination section that determines whether the slider has contacted the stopper during movement of the slider by the movement control section.

Also, the work machine according to another aspect further comprises: a notifying device that notifies an operator in a case in which the distance between the first attachment section and the second attachment section detected by the attachment section spacing distance detector is different from a planned distance between the first attachment section and the second attachment section.

Also, the work machine according to another aspect in an aspect in which the multiple set distances are set based on at least a dimension of each of the two work heads, and a dimension of a work target piece of each of the two work heads.

Effects

In the work machine of the disclosure, the slider is configured from a main body, a first attachment section, and a second attachment section. The first attachment section is provided on the main body and is a section to which one of the two work heads is attached. The second attachment section is provided on the main body at a set distance from the first attachment section so as to be changeable between any one of multiple set distances set in advance, and is a section to which the other one of the two work heads is attached. According to this configuration, it is possible to change the distance between the first attachment section and the second attachment section (hereinafter sometimes referred to as "attachment section spacing distance"), thus is it possible to attach two wide work heads to the slider. Also, even in a case in which the types of the two work heads are not to be changed, it is possible to easily change the spacing between the two work heads, which is convenient. Also, by changing the spacing between the two work heads, it is possible to prevent interference of the work heads.

Also, with the work machine according to another aspect of the disclosure, provided is an attachment section spacing distance detector configured from multiple detected sections and multiple sensors. With a slider for which the distance between attachment sections is changeable, because the movement range and so on of the slider also changes according to the change in the distance between the attachment sections, an attachment section spacing distance detector is required for detecting the distance between the attachment sections. The attachment section spacing distance detector is generally configured from a detected section and a sensor for detecting the detected section; the detected section is provided on one of the main body and the second attachment; the sensor is provided on the other one of the main body and the second attachment. The relative position of the main body and the second attachment section is recognized based on the detection of the detected section by the sensor, thus the distance between the attachment sections is detected. However, if detection of the detected section by the sensor is not performed appropriately, there is a worry that a mistaken distance between attachment sections will be detected. In consideration of this, with the work machine according to this aspect, the distance between attachment sections is detected when at least one of the multiple detected sections is detected by two sensors among the multiple sensors. In other words, for example, in a case in which only one sensor of the multiple sensors detects the detected section, it is assumed that a problem is occurring with a different sensor to the sensor that detected the detected section, thus the distance between attachment sections is not detected. By this, it is possible to prevent the detection of a mistaken distance between attachment sections while a problem is occurring with the sensor or the like.

Also, with the work machine according to another aspect, the quantity of the multiple sensors is smaller than the quantity of distances between attachment sections that can be detected. By this, it is possible to detect the distance between attachment sections with a small quantity of sensors, thus reducing costs.

Also, with the work machine according to another aspect, the distance between attachment sections is detected when a detected section is detected by two sensors which are not adjacent to each other among the multiple sensors, or when a detected section is detected by two sensors which are adjacent to each other among the multiple sensors. With a conventional attachment section spacing distance detector, the distance between attachment sections was detected when a detected section was detected by two sensors which are adjacent to each other among the multiple sensors. However, the quantity of combinations of two adjacent sensors among the multiple sensors is one fewer than the quantity of multiple sensors, and only that quantity of distances between attachment sections can be detected. On the other hand, with the work machine according to this aspect, the distance between attachment sections is detected not only when a detected section is detected by two sensors which are adjacent to each other among the multiple sensors, but also when a detected section is detected by two sensors which are not adjacent to each other. By this, it is possible to detect a larger quantity of distances between attachment sections with fewer sensors, which is advantageous from a cost perspective.

Also, the work machine according to another aspect is provided with a moving device that moves the slider in a specified direction, a control device that controls the moving device, and a stopper that limits the movement amount of the slider. The stopper is capable of changing the movement amount of the slider based on the distance between attachment sections. Also, the control device acquires the movement amount of the slider based on the distance between attachment sections detected by the attachment section spacing distance detector, and moves the slider towards the stroke end of the acquired movement amount of the slider. Here, the control device determines whether the slider has contacted the stopper. When the distance between attachment sections changes, the possible movement amount of the slider in the specified direction also changes. Thus, with the work machine according to this aspect, the stopper is capable of changing the movement amount of the slider based on the distance between attachment sections. However, if the change in the movement amount due to the slider is not appropriate, there is a possibility that a work head attached to the slider will impact a side wall or the like of the work machine. In consideration of this, with the work machine according to this aspect, the control device moves the slider towards the stroke end of the movement amount of the slider based on the distance between attachment sections, and determines whether the slider has contacted the stopper. Here, if the slider contacts the stopper at the stroke end, the changing in the movement amount due to the stopper is performed correctly. On the other hand, if the slider does not contact the stopper at the stroke end, or if the slider contacts the stopper at a position other than the stroke end, the changing in the movement amount clue to the stopper is not being performed correctly. By determining whether the changing in the movement amount of the stopper is appropriate in this way, it is possible to prevent the impact of a work head attached to the slider against a side wall or the like.

Also, with the work machine according to another aspect, in a case in which the distance between attachment sections detected by the attachment section spacing distance detector is different to a planned distance between attachment sections, notifying an operator is performed. By this, it is possible to instruct the operator to change to an appropriate distance between attachment sections.

Also, with the work machine according to another aspect, the distance between attachment sections is set based on at least one of a dimension of a head attached to the slider, and a dimension of the work target piece of the work head. Thus, it is possible to attach even a large work head to the slider appropriately. Also, it is possible to appropriately perform work by the work head attached to the slider.

DESCRIPTION OF PREFERRED EMBODIMENT

The following describes in detail referring to the figures an example embodiment of the present disclosure.

Board Work Device Configuration

Figure 1:
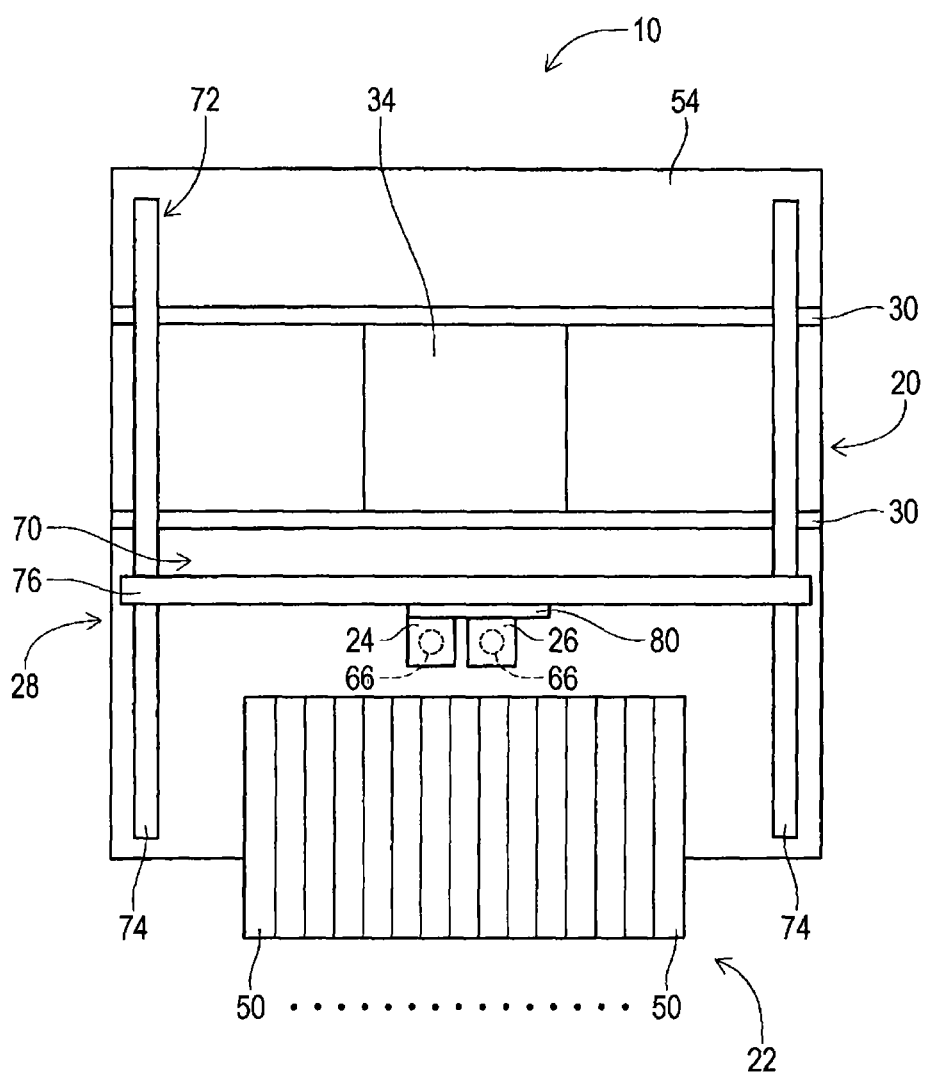
FIG. 1 shows a board work machine which is an embodiment of the present disclosure.
Figure 1:
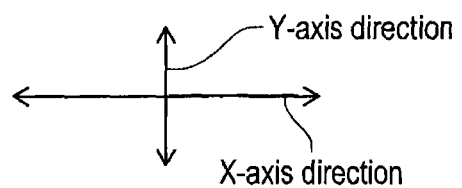

FIG. 1 shows board work device 10 that is an embodiment of the present disclosure. Board work device 10 is a device for performing mounting work of electronic components onto a circuit board. Board work device 10 is provided with conveyance device 20, supply device 22, two mounting heads 24 and 26, and mounting head moving device (hereinafter sometimes referred to as "moving device") 28.

Conveyance device 20 has a pair of conveyor belts 30 that extend in the X-axis direction, and electromagnetic motor (refer to FIG. 8) 32 that rotates conveyor belts 30. Circuit board 34 is supported by this pair of conveyor belts 30 and is conveyed in the X-axis direction by the driving of electromagnetic motor 32. Also, conveyance device 20 has board holding device (refer to FIG. 8) 36. Board holding device 36 fixedly holds circuit board 34 supported by conveyor belts 30 in a predetermined position (the position at which circuit board 34 is shown in FIG. 1).

Supply device 22 is a feeder type supply device that has multiple tape feeders 50. Tape feeders 50 house taped components in a wound state. Taped components are electronic components that have been put into tape. Tape feeders 50 deliver the taped components using an indexing device (refer to FIG. 8). By this, feeder type supply device 22 supplies an electronic component to a supply position by the indexing of taped components. Note that, tape feeders are detachable from base 54. By this, it is possible to exchange electronic components and handle situations such as electronics components running low.

The two mounting heads 24 and 26 mount electronic components onto a circuit board. In detail, one of the two mounting heads 24 and 26 (below, sometimes given as first mounting head 24) has suction nozzle 60 provided on the lower surface. Suction nozzle 60 is connected to a positive/negative pressure supply device (refer to FIG. 8) 62 via a negative pressure air/positive pressure air supply passage. Suction nozzle 60 picks up and holds an electronic component using negative pressure, and releases the held electronic component using positive pressure. On the other hand, the other of the two mounting heads 24 and 26 (below, sometimes given as second mounting head 26) has holding tool 66 provided on the lower surface. Holding tool 66 has two claws (not shown) and the two claws close/open by the supply of negative pressure or positive pressure from positive/negative pressure supply device 62. An electronic component is held by the two claws by this closing of the two claws. And, the held electronic component is released by the opening of the two claws.

Moving device 28 moves first mounting head 24 and second mounting head 26 to any position on base 54. In detail, moving device 28 is configured from X-axis direction slider mechanism 70 and Y-axis direction slide mechanism 72. Y-axis direction slide mechanism 72 has a pair of Y-axis direction guide rails 74, and that pair of Y-axis direction guide rails 74 are provided extending in the Y-axis direction. On the other hand, X-axis direction slide mechanism 70 has X-axis direction guide rail 76, and that X-axis direction guide rail 76 extends in the X-axis direction on the pair of Y-axis direction guide rails 74. Y-axis direction slide mechanism 72 has electromagnetic motor (refer to FIG. 8) 78, and X-axis direction guide rail 76 is moved to any position in the Y-axis direction by the driving of electromagnetic motor 78. X-axis direction guide rail 76 holds slider 80 as to be movable along its own axis, X-axis direction slide mechanism 70 has electromagnetic motor (refer to FIG. 8) 82, and slider 80 is moved to any position in the X-axis direction by the driving of electromagnetic motor 82. First mounting head 24 and second mounting head 26 are attached to the slider 80. With such a configuration, first mounting head 24 and second mounting head 26 are moved to any position on base 54 by moving device 28. Note that, each of first mounting head 24 and second mounting head 26 is attachable/detachable to/from slider 80 with one touch. By this, as described later, it is possible to change to a work head of a different type.

Figure 2:
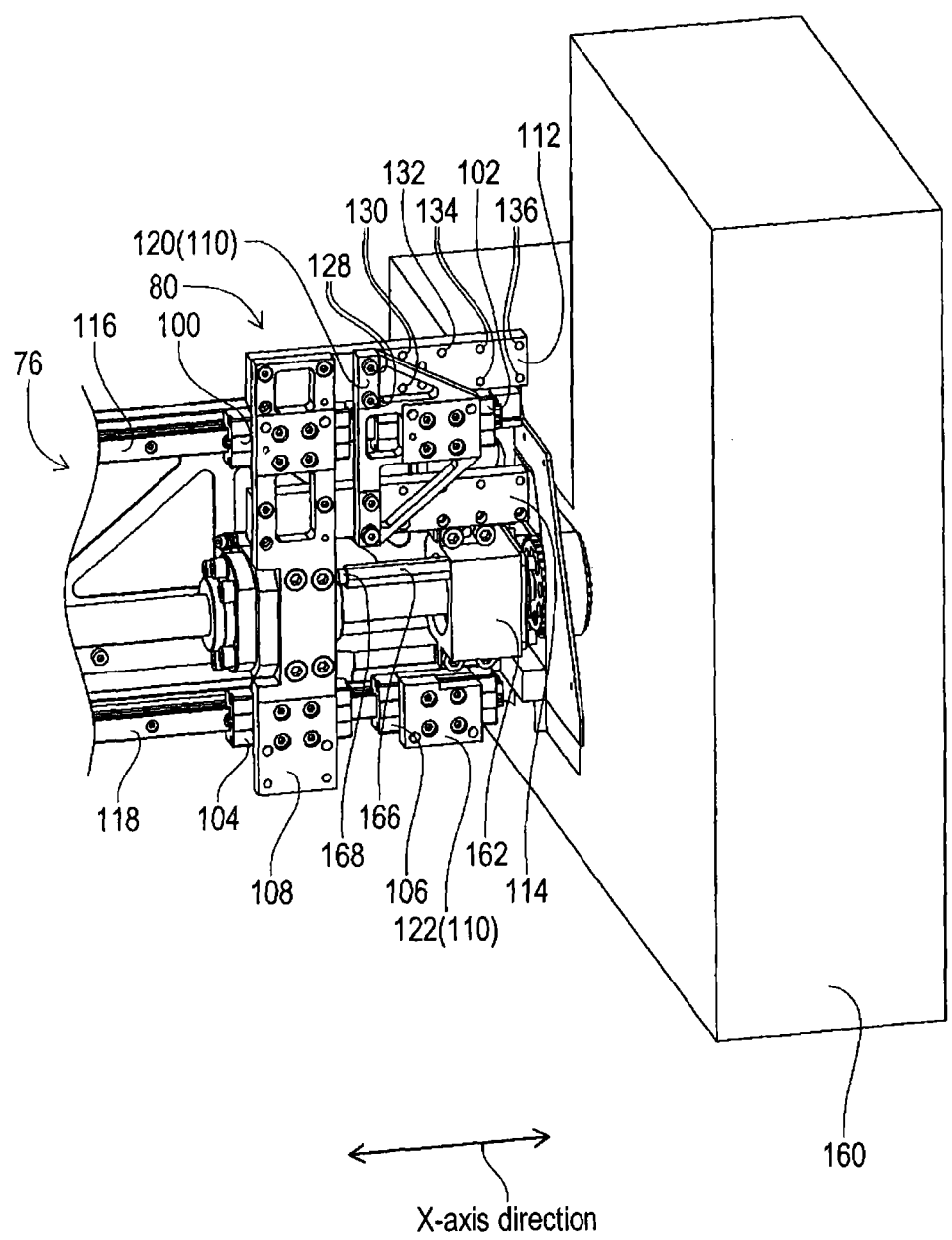
FIG. 2 is a perspective view showing a slide that is provided on the board work machine.

Also, the distance between first mounting head 24 and second mounting head 26 attached to slider 80 can be changed. In detail, as shown in FIG. 2, slider 80 is configured from four slide sections 100, 102, 104, and 106, first attachment section 108, second attachment section 110, and two holding sheets 112 and 114. X-axis direction guide rail 76 that holds slider 80 has a pair of rails 116 and 118, and that pair of rails 116 is provided extending parallel to each other in the X-axis direction. Further, the two slide sections 100 and 102 out of the four slide sections 100, 102, 104, and 106 are movably held on rail 116, while the remaining other two slide sections 104 and 106 out of the four slide sections 100, 102, 104, and 106 are movably held on rail 118.

First attachment section 108 is a generally rectangular plate member. First attachment section 108 extends in an up/down direction, is fixed to slide section 100 at an upper portion, and is fixed to slide 104 at a lower portion. By this, first attachment section 108 slides in the X-axis direction. Also, the two holding plates 112 and 114 are each fixed to first attachment section 108 at an end portion and extend parallel to each other in the X-axis direction. Note that, the two holding plates 112 and 114 are parallel to rails 116 and 118, and rail 116 is positioned between the two holding plates 112 and 114.

Second attachment section 110 is configured from upper plate member 120 and lower plate member 122. Upper plate member 120 is generally a trapezoid and is fixed to slide section 102 such that the short side of the trapezoid extends in an up/down direction. The upper end and lower end of upper plate member 120 extend above the two holding plates 112 and 114. Multiple screw holes (not shown) are formed in the upper end and lower end of upper plate member 120 that extends above the holding plates 112 and 114. Also, multiple screws holes (refer to FIG. 4) 127 are formed in holding plates 112 and 114 at locations corresponding to the screw holes of upper plate member 120. Further, a screw 128 is screwed into the screw holes of upper plate member 120 and screw hole 127 of holding plates 112 and 114 such that upper plate member 120 and holding plates 112 and 114 are fixed together. By this, upper plate member 120 of second attachment section 110 slides in the X-axis direction along with first attachment section 108.

Also, multiple screw holes 130 are formed in holding plates 112 and 114 in a location A mm from screw holes 127 in the X-axis direction. Further, multiple screw holes 134 are formed in a location A mm from screw holes 132 in the X-axis direction, and multiple screw holes 136 are formed in a location A mm from screw holes 134 in the X-axis direction. Screw holes 130, 132, 134, and 136 have the same shape as screw holes 127 into which screw 128 is screwed, and are formed at locations corresponding to the screw holes of upper plate member 120.

For this reason, it is possible to remove screw 128 from screw hole 127 of holding plates 112 and 114 and from the screw hole of upper plate member 120 and to screw 128 into another screw hole 130, 132, 134, and 136 of holding plates 112 and 114, and into a screw hole of upper plate member 120. In other words, it is possible to change the attachment location of upper plate member 120 to holding plates 112 and 114. Further, by changing the attachment location of upper plate member 120 to holding plates 112 and 114, the distance between first attachment section 108 and upper plate member 120 (hereinafter sometimes referred to as "distance between attachment sections") changes.

Figure 3:
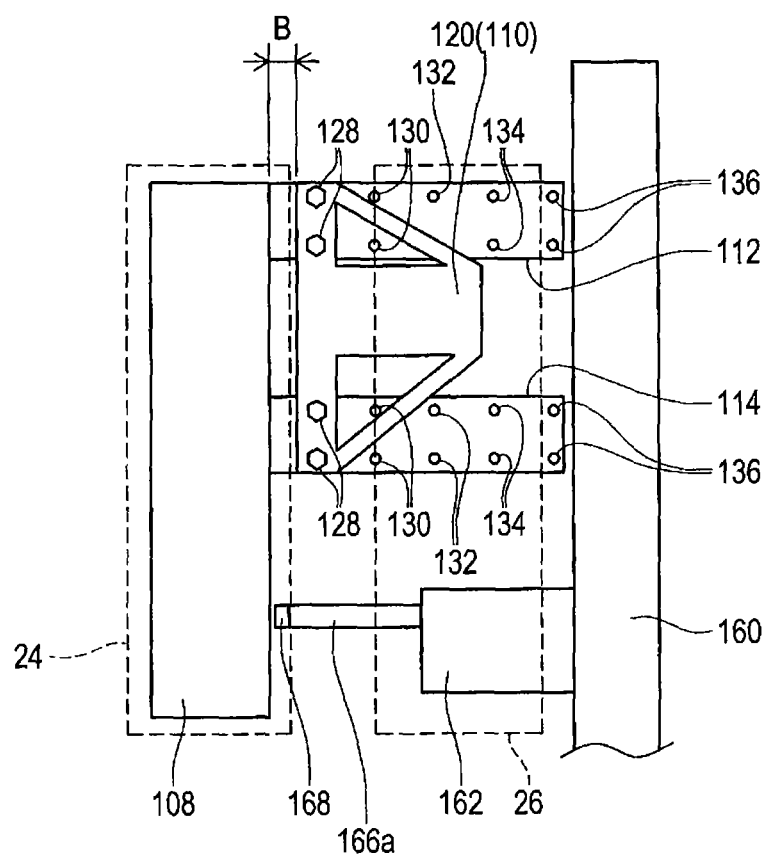
FIG. 3 is a plan view showing a slider for which the distance between attachment sections is B mm.
Figure 3:
Figure 4:
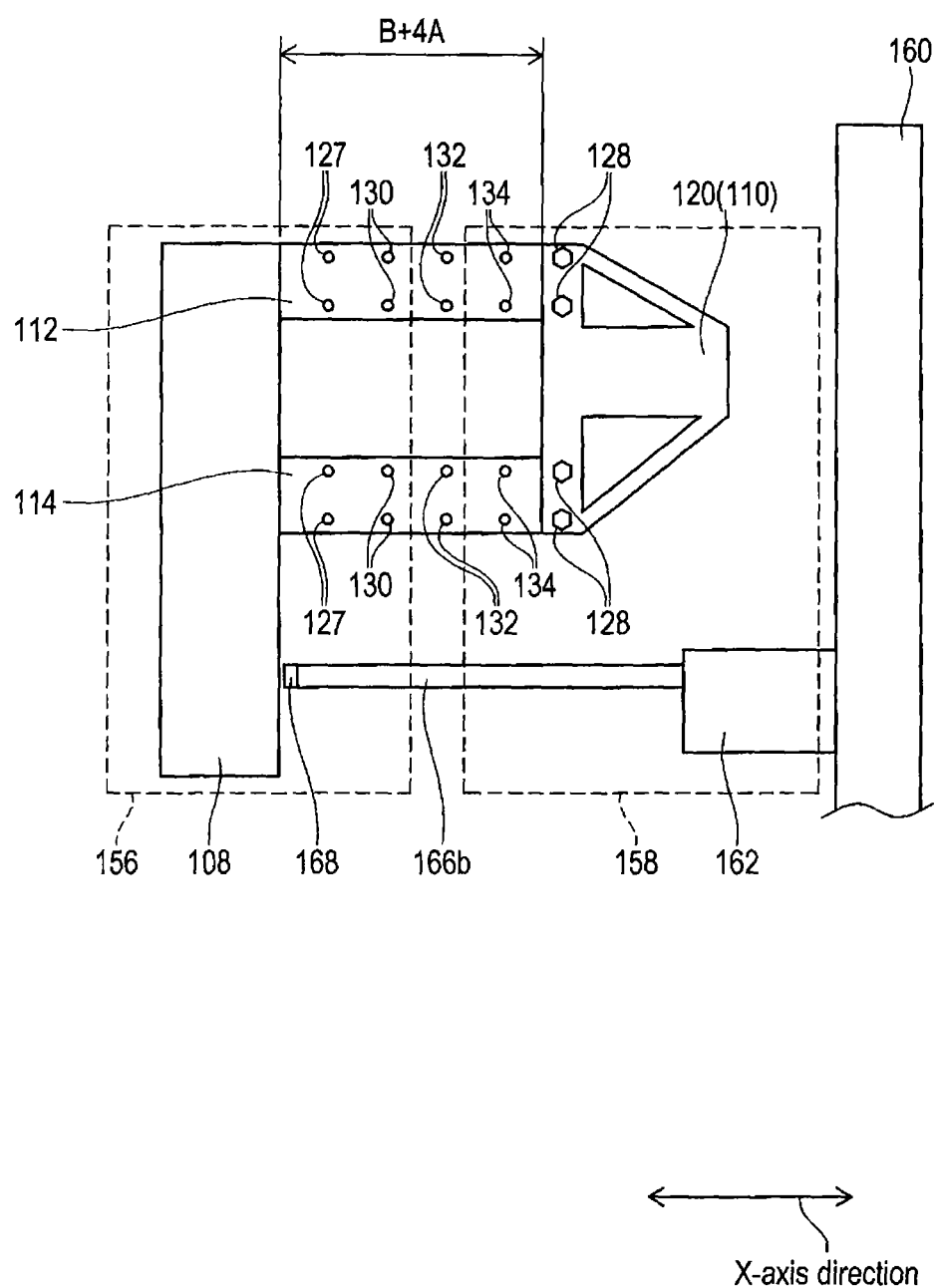
FIG. 4 is a plan view showing a slider for which the distance between attachment sections (B+4×A).

Specifically, in a case in which a screw 128 is screwed into a screw hole 127 of holding plates 112 and 114 and into a screw hole of upper plate member 120, as shown in FIG. 3, the distance between attachment sections is B mm. Also, for example, in a case in which screw 128 is screwed into a screw hole 136 of holding plates 112 and 114 or a screw hole of upper plate member 120, as shown in FIG. 4, the distance between attachment sections becomes (B+4×A). Thus, it is possible to change the distance between attachment sections by changing the location at which upper plate member 120 is attached to holding plates 112 and 114.

Figure 5:
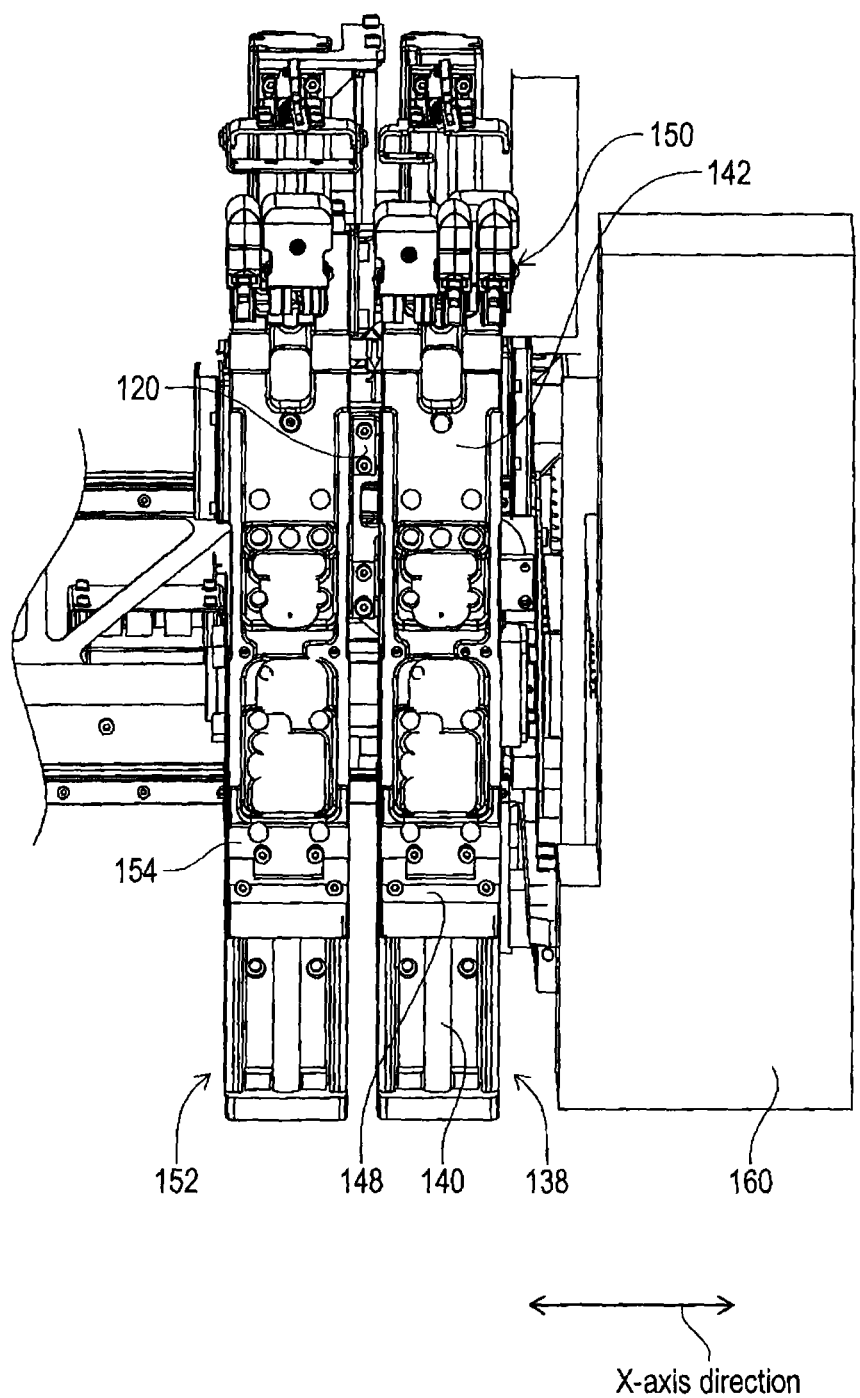
FIG. 5 is a perspective view showing a slider to which head raising/lowering devices are attached.

Also, as shown in FIG. 2, lower plate member 122 is fixed to slide section 106 and slides in the X-axis direction. Further, lower plate member 122 is slid so as to be positioned directly below upper plate member 120, and as shown in FIG. 5, head raising/lowering device 138 is fixed to upper plate member 120 and lower plate member 122. Head raising/lowering device 138 has main body 140 and slide plate 142. Main body 140 is fixed to upper plate member 120 at an upper end, and is fixed to lower plate member 122 at a lower end. Slide plate 142 is movably held in an up/down direction on main body 140, and is moved to any position in the up/down direction by the operation of electromagnetic motor (refer to FIG. 8) 146.

Head holding section 148 is provided on the lower end of slide plate 142, and the lower end of second mounting head 26 is held on that head holding section 148. Also, lock mechanism 150 is provided on the upper end of slide plate 142. Lock mechanism 150 locks the upper end of second mounting head 26 with one touch, and releases the lock with one touch. By this, second mounting head 26 is attached on slide plate 142 so as to be detachable/attachable with one touch. In this way, second mounting head 26 is attached to upper plate member 120 and lower plate member 122, that is second attachment section 110, via head raising/lowering device 138, and is moved to any position in an up/down direction by head raising/lowering device 138. Note that, head raising/lowering device 152 with the same configuration as head raising/lowering device 138 is also fixed on first attachment section 108, and first mounting head 24 is attached one slide plate 154 of head raising/lowering device 152 so as to be detachable/attachable with one touch.

According to this kind of configuration, by changing the attachment location of upper plate member 120 on holding plates 112 and 114, it is possible to change the distance between first mounting head 24 and second mounting head 26 attached to slider 80. By this, for example, by changing the attachment location of upper plate member 120 on holding plates 112 and 114 based on a dimension and so on of a work head attached to slider 80, it is possible to attach work heads with various dimensions to slider 80.

Specifically, for example, the width of first mounting head 24 and second mounting head 26 is relatively narrow. Therefore, as shown in FIG. 3, in a case in which screw 128 is screwed into screw hole 127 of upper plate member 120 and a screw hole of holding plates 112 and 114, that is, in a case in which the distance between attachment sections is at its smallest, first mounting head 24 and second mounting head 26 can be attached to first attachment section 108 and second attachment section 110. However, with a work head that is wider than first mounting head 24 and so on, there are cases in which work heads collide and cannot be attached to first attachment section 108 and second attachment section 110. In such cases, for example, as shown in FIG. 4, screw 128 is screwed into screw hole 136 of upper plate member 120 and a screw hole of holding plates 112 and 114 such that the distance between attachment sections is made wider. By this, even wide work heads 156 and 158 can be attached to first attachment section 108 and second attachment section 110.

Also, the distance between attachment sections can be changed based not only on a dimension of a work head, but on a dimension of a work target piece of a work head. Specifically, for example, in a case in which a work head is a mounting head and a dimension of an electronic component that is a holding target of the mounting head is large, the electronic component held by the mounting head may enter the work area of another work head. In such a case, by increasing the distance between attachment sections, the overlapping of work areas of two work heads can be avoided even when holding a large electronic component.

In this way, with board work device 10, by changing the distance between attachment sections, it is possible to attach work heads with various dimensions to slider 80, making it possible to appropriately perform work on work target pieces of various dimensions. In other words, the distance between attachment sections on board work device 10, that is, the attachment location of upper plate member 120 to holding plates 112 and 114, is set based on a dimension of a work head, or a dimension of a work target piece or the like.

Further, with board work device 10, two mounting heads 24 and 26 are attached to slider 80, and the slider 80 is moved in the X-axis direction by the driving of electromagnetic motor 82. That is, with board work device 10, two mounting heads are moved simultaneously in the X-axis direction by the driving of one electromagnetic motor. However, on a conventional board work device, each of the two mounting heads is moved in the X-axis direction by the driving of a corresponding electromagnetic motor, such that the movement range of each mounting head overlaps. With this kind of board work device, there is a possibility that, due to an operation program entry mistake or the like, the mounting heads will collide with each other and be damaged. However, with board work device 10, the two mounting heads 24 and 26 are mechanically fixed to slider 80, and the slider 80 is moved by the driving of one electromagnetic motor 82. Thus, even in a case in which unexpected movement occurs with electromagnetic motor 82, it is possible to reliably prevent mounting heads 24 and 26 colliding with each other.

Also, a stopper that limits the movement of slider 80 in the X-axis direction is provided on board work device 10, and the stopper is changed according to the distance between attachment sections. In detail, as shown in FIG. 2, stopper attachment section 162 is provided on side wall 160 of board work device 10, and stopper 166 is attached to the stopper attachment section 162. Stopper 166 is rod-shaped and extends in a direction approaching first attachment section 108 of slider 80. Rubber member 168 is attached to an end of stopper 166, and by slider 80 moving in a direction approaching stopper 166, first attachment section 108 contacts rubber member 168 of stopper 166. By this, movement of slider 80 in the X-axis direction is limited, which makes it possible to prevent a work head attached to slider 80 colliding with side wall 160.

Fives stoppers 166 that contact first attachment section 108 are prepared based on the attachment location of upper plate member 120 to holding plates 112 and 114, that is on the distance between the attachment sections, and stopper 166 is exchanged based on the distance between attachment sections. Specifically, at the base end of each of the five stoppers 166 a thread (not shown) of the same shape is formed, and a screw hole (not shown) that can engage with that thread is formed in stopper attachment section 162. Also, an operator selects a stopper 166 from the five stoppers 166 based on the distance between attachment sections, and screws the base end of that stopper 166 into the screw hole of stopper attachment section 162. For example, in a case in which screw 128 is screwed into screw hole 127 of upper plate member 120 and a screw hole of holding plates 112 and 114, as shown in FIG. 3, stopper 166a is attached to stopper attachment section 162. On the other hand, in a case in which screw 128 is screwed into screw hole 136 of upper plate member 120 and a screw hole of holding plates 112 and 114, as shown in FIG. 4, stopper 166b which is longer than stopper 166a is attached to stopper attachment section 162. In this way, by changing the length of stopper 166 based on the distance between attachment sections, as described in detail below, slider 80 contacts stopper 166, and it is possible to set an origin point position (stroke end) based on the distance between attachment sections. By this, during actual operation, it is possible to move second mounting head 26 close to side wall 160 without second mounting head 26 and the like colliding with side wall 160, and a work area of mounting head 26 and the like can be made as wide as possible.

Figure 6:
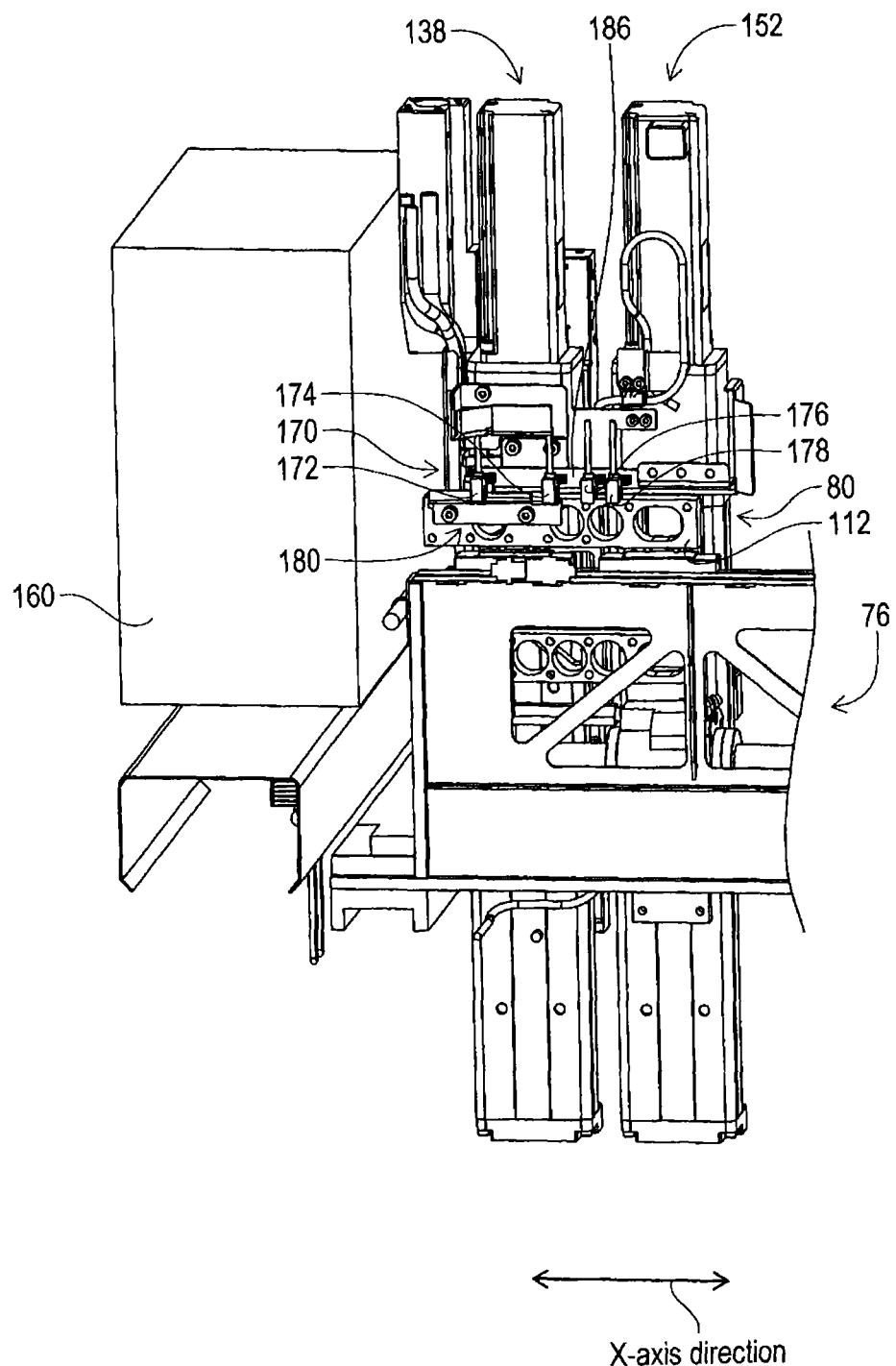
FIG. 6 is a perspective view showing the slider from behind.

Further, detection device 170 that detects the distance between attachment sections is provided on slider 80. In detail, as shown in FIG. 6, detection device 170 is configured from four proximity sensors 172, 174, 176, and 178, and detected member 180. Note that, FIG. 6 shows a view of X-axis direction guide rail 76 and slider 80 from behind.

Figure 7:
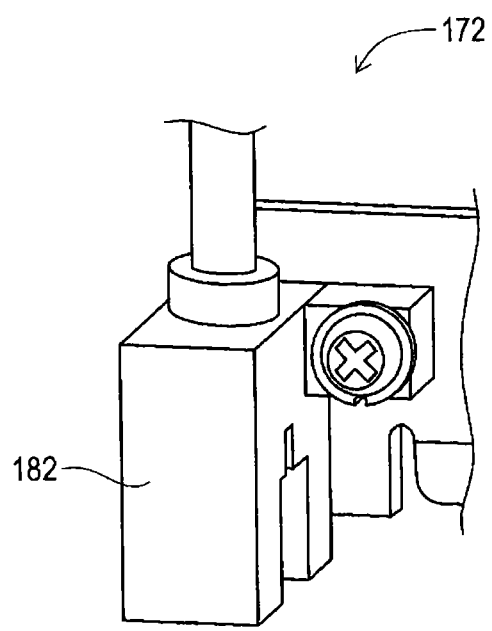
FIG. 7 is an enlarged view showing a proximity sensor provided on the detection device.

As shown in FIG. 7, each of proximity sensors 172, 174, 176, and 178 has a detection section 182 that is substantially U-shaped. Detection section 182 is U-shaped formed from a light emitter that emits light and a light receiver that receives light as a pair, and if some kind of body (for example, a dog plate) enters the pair from the opening section of the U-shape, the body is detected by the light from the light emitter being blocked. Also, proximity sensors 172, 174, 176, and 178 are fixed to sensor fixing section 186 such that the opening section of detection section 182 is pointing downwards. As shown in FIG. 6, sensor fixing section 186 is fixed to the rear surface of head raising/lowering device 138 extending in the X-axis direction. In other words, sensor fixing section 186 is fixed to upper plate member 120 via head raising/lowering device 138. Note that, sensor fixing section 186 is provided in a state parallel to holding plate 112.

Figures 9, 10:
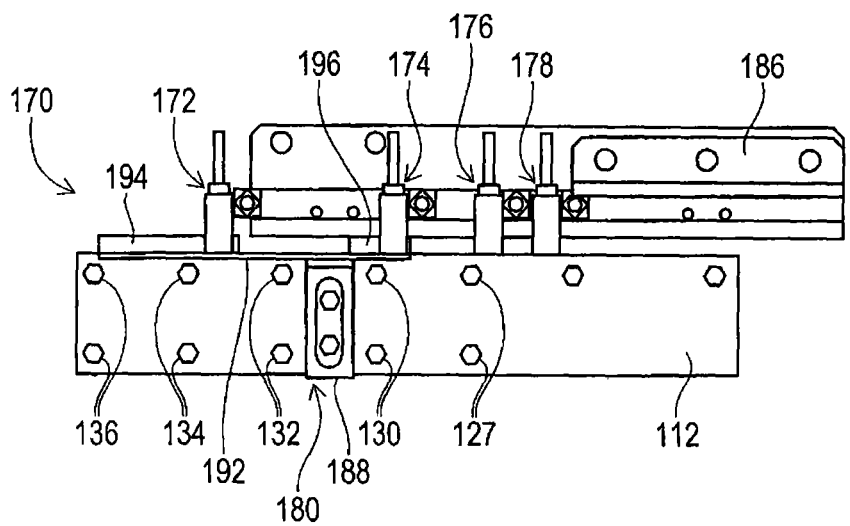
FIG. 9 shows the relative positional relationship of the proximity sensors and the protrusions in a state where the distance between attachment sections is B mm.
FIG. 10 is a table showing the relationship between the distance between the attachment sections and the on signal of the proximity switches of the embodiment.

On the other hand, as shown in FIG. 9, detected member 180 is configured from fixing section 188, extending section 192, and two protruding sections 194 and 196. Fixing section 188 is fixed to holding plate 112. Extending section 192 is fixed to an upper section of fixing section 188 and extends along the upper edge of holding plate 112. Protruding sections 194 and 196 protrude upwards from extending section 192 and are separated from each other in the X-axis direction.

As described above, proximity sensors 172, 174, 176, and 178 are attached to upper plate member 120 via head raising/lowering device 138; detected member 180 is attached to holding plate 112. Thus, the relative position of proximity sensors 172, 174, 176, and 178 with respect to detected member 180 changes according to a change in the attachment location of upper plate member 120 to holding plate 112, that is, to a change in the distance between attachment sections. Protrusions 194 and 196 enter from the opening section of detection section 182 of a specific sensor among proximity sensors 172, 174, 176, 178, and the presence of protruding section 194 and 196 is detected by the specific sensor. Also, the distance between the attachment sections is detected based on the proximity sensors 172, 174, 176, and 178 detecting the presence of protruding sections 194 and 196. The detection method for the distance between attachment sections of detection device 170 is described in detail below.

Figure 8:
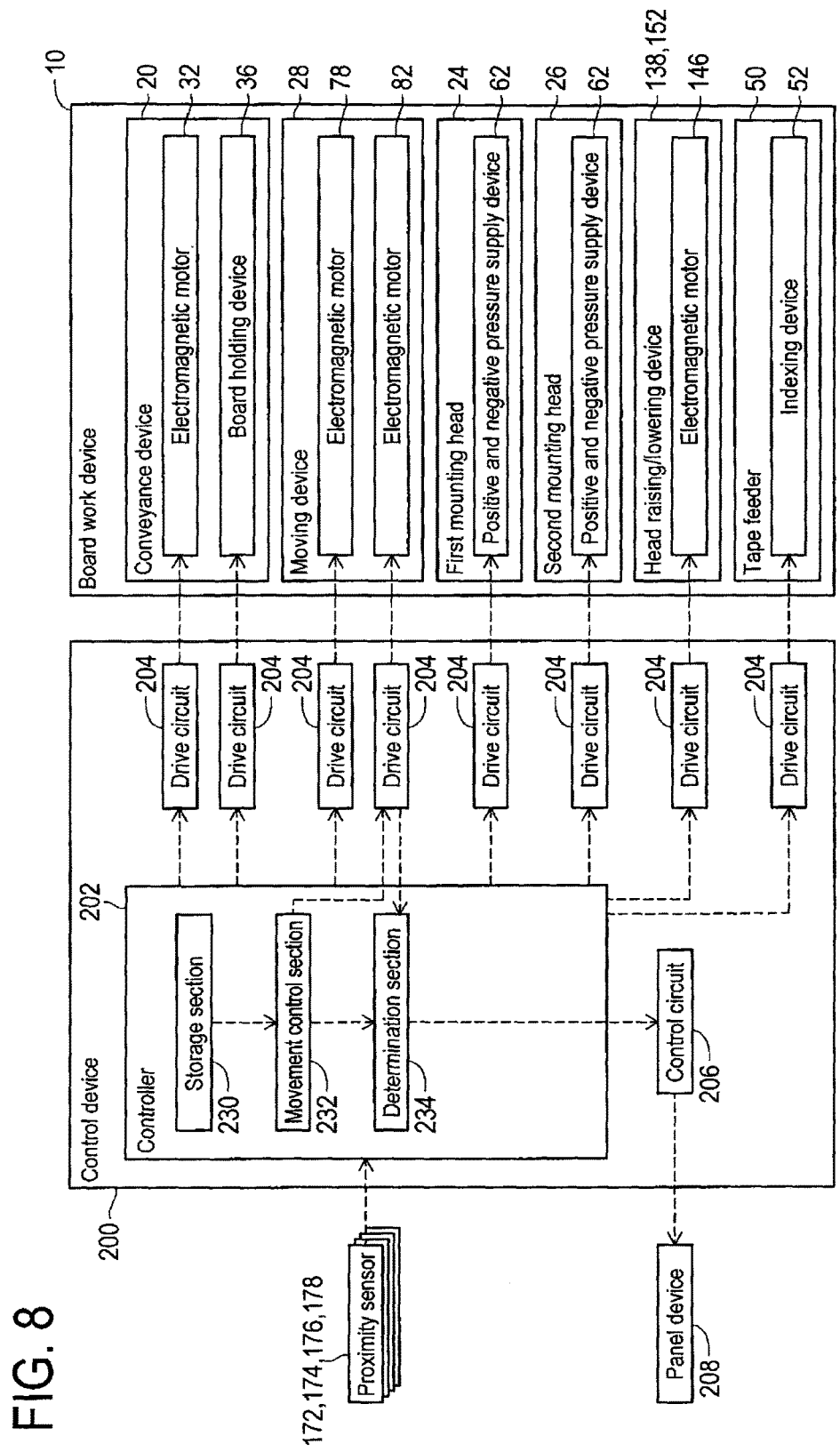
FIG. 8 is a block diagram showing the control device provided on the board work device.

Also, as shown in FIG. 8, board work device 10 is provided with control device 200. Control device 200 is provided with controller 202 and multiple drive circuits 204. Multiple drive circuits 204 are connected to electromagnetic motors 32, 78, 82, and 146, board holding device 36, indexing device 52, and positive/negative pressure supply device 62. Controller 202 is provided with a CPU, ROM, RAM, and so on, is formed mainly from a computer, and is connected to the multiple drive circuits 204. By this, the operation of conveyance device 20, moving device 28, and so on is controlled by controller 202.

Also, controller 202 is connected to panel device 208 via control circuit 206. Panel device 208 displays information required for work, error information, and so on, and what to display on panel device 208 is controlled by controller 202. Further, controller 202 is connected to proximity sensors 172, 174, 176, and 178, and a detection value of proximity sensors 172, 174, 176, and 178 is input into controller 202. Specifically, when protruding sections 194 and 196 are entered into the opening section of detection section 182 of proximity sensors 172, 174, 176, and 178, an on signal is entered; and when protruding sections 194 and 196 are not entered into the opening section of detection section 182, an off signal is entered.

<Detection of the Distance Between Attachment Sections by the Detection Device>

With board work device 10, information such as a dimension of a work head that is planned to be attached to slider 80, or a dimension of a work target piece of the work head, is input into controller 202, and an optimal distance between attachment sections is calculated based on this information. Then, that calculated distance between attachment sections, that is, the attachment location of upper plate member 120 to holding plates 112 and 114, is displayed on panel device 208 and an operator attaches upper plate member 120 to holding plates 112 and 114 based on that display. When upper plate member 120 is attached to holding plates 112 and 114, the distance between attachment sections is detected by detection device 170 and it is checked whether the attachment location of upper plate member 120 is appropriate.

The detection method of the distance between attachment sections by detection device 170 is described in detail below. Note that, when distinguishing between the four proximity sensors 172, 174, 176, and 178, these are given as, in order from an end of sensor fixing section 186, first proximity sensor 172, second proximity sensor 174, third proximity sensor 176, and fourth proximity sensor 178. Also, when distinguishing between protruding sections 194 and 196, the wide one of these is referred to as first protruding section 194, and the narrow one of these is referred to as second protruding section 196.

First, the relative positional relationship of proximity sensors 172, 174, 176, and 178 with respect to protruding sections 194 and 196 is shown in FIG. 9 in a case in which screw 128 is screwed into screw hole 127 of holding plates 112 and 114 and a screw hole of upper plate member 120, that is, in a case in which the distance between attachment sections is B mm (refer to FIG. 3). As is apparent from the figure, first protruding section 194 is entered into the opening section of detection section 182 of first proximity sensor 172, and second protruding section 196 is entered into the opening section of detection section 182 of second proximity sensor 174. By this, an on signal is input into controller 202 from first proximity sensor 172 and second proximity sensor 174. Map data corresponding to the table shown in FIG. 10 is stored in controller 202 and controller 202 calculates the distance between attachment sections as B mm from the map data based on the on signals from first proximity sensor 172 and second proximity sensor 174.

Figure 11:
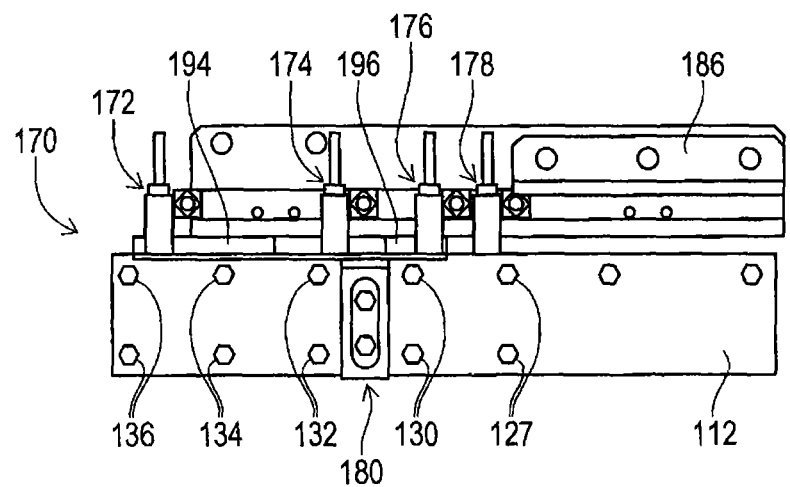
FIG. 11 shows the relative positional relationship of the proximity sensors and the protrusions in a state where the distance between attachment sections is (B+A) mm.

Also, the relative positional relationship of proximity sensors 172, 174, 176, and 178 with respect to protruding sections 194 and 196 is shown in FIG. 11 in a case in which screw 128 is screwed into screw hole 130 of holding plates 112 and 114 and a screw hole of upper plate member 120, that is, in a case in which the distance between attachment sections is (B+A) mm. As is apparent from the figure, first protruding section 194 is entered into the opening section of detection section 182 of first proximity sensor 172, and second protruding section 196 is entered into the opening section of detection section 182 of third proximity sensor 176. By this, an on signal is input into controller 202 from first proximity sensor 172 and third proximity sensor 176. Then, controller 202 calculates the distance between attachment sections as (B+A) mm from the map data based on the on signals from first proximity sensor 172 and third proximity sensor 176.

Figure 12:
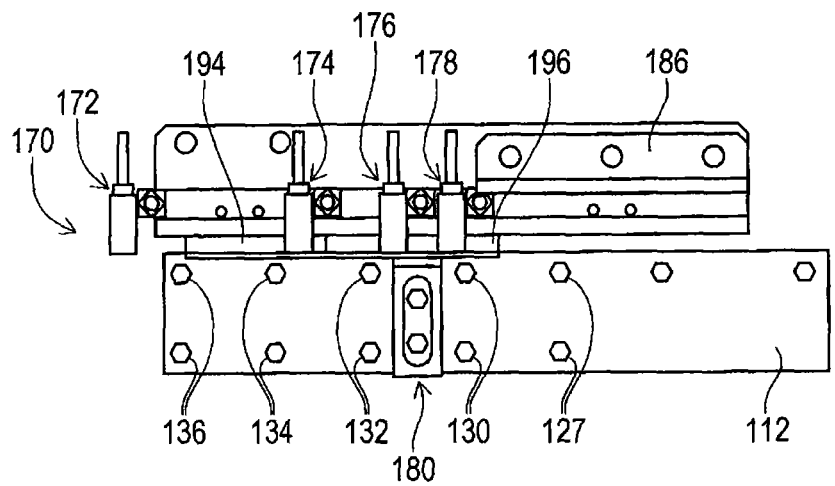
FIG. 12 shows the relative positional relationship of the proximity sensors and the protrusions in a state where the distance between attachment sections is (B+2×A) mm.

Also, the relative positional relationship of proximity sensors 172, 174, 176, and 178 with respect to protruding sections 194 and 196 is shown in FIG. 12 in a case in which screw 128 is screwed into screw hole 132 of holding plates 112 and 114 and a screw hole of upper plate member 120, that is, in a case in which the distance between attachment sections is (B+2×A) mm. As is apparent from the figure, first protruding section 194 is entered into the opening section of detection section 182 of second proximity sensor 174, and second protruding section 196 is entered into the opening section of detection section 182 of fourth proximity sensor 178. By this, an on signal is input into controller 202 from second proximity sensor 174 and fourth proximity sensor 178. Then, controller 202 calculates the distance between attachment sections as (B+2×A) mm from the map data based on the on signals from second proximity sensor 174 and fourth proximity sensor 178.

Figure 13:
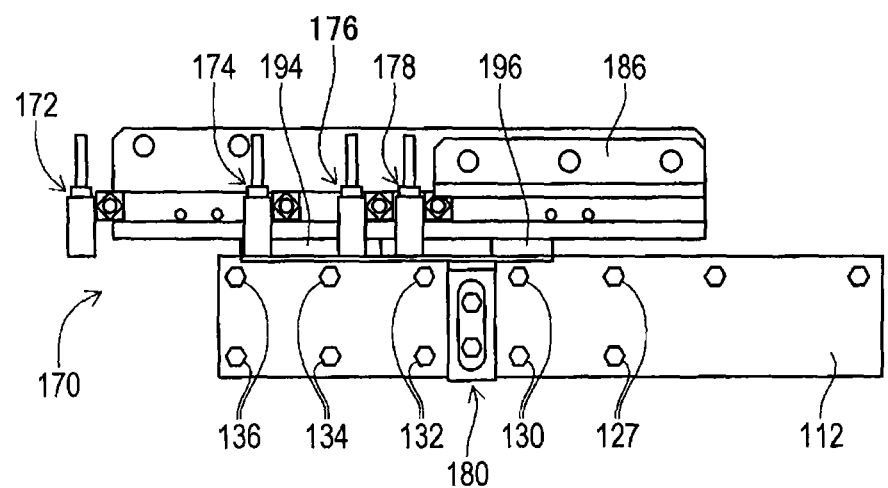
FIG. 13 shows the relative positional relationship of the proximity sensors and the protrusions in a state where the distance between attachment sections is (B+3×A) mm.

Also, the relative positional relationship of proximity sensors 172, 174, 176, and 178 with respect to protruding sections 194 and 196 is shown in FIG. 13 in a case in which screw 128 is screwed into screw hole 134 of holding plates 112 and 114 and a screw hole of upper plate member 120, that is, in a case in which the distance between attachment sections is (B+3×A) mm. As is apparent from the figure, first protruding section 194 is entered into the opening section of detection section 182 of second proximity sensor 174 and the opening section of detection section 182 of third proximity sensor 176. By this, an on signal is input into controller 202 from second proximity sensor 174 and third proximity sensor 176. Then, controller 202 calculates the distance between attachment sections as (B+3×A) mm from the map data based on the on signals from second proximity sensor 174 and third proximity sensor 176.

Figure 14:
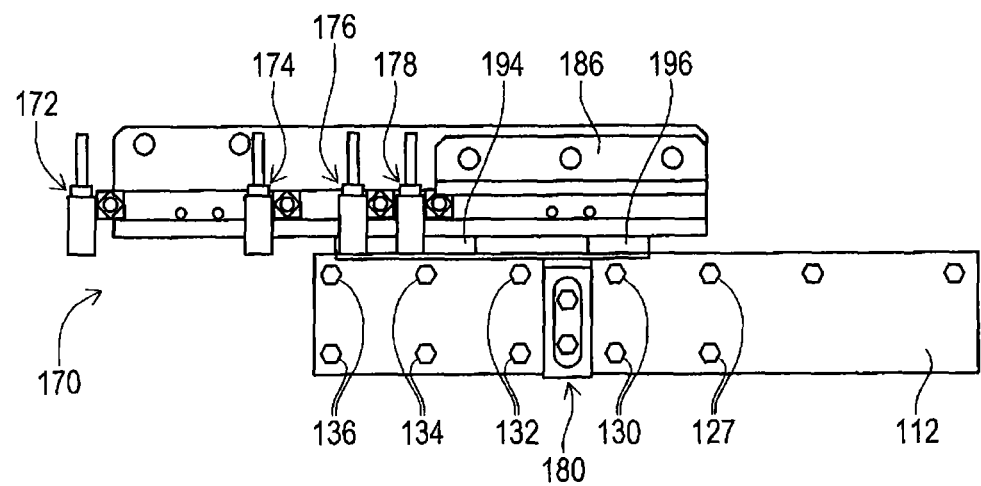
FIG. 14 shows the relative positional relationship of the proximity sensors and the protrusions in a state where the distance between attachment sections is (B+4×A) mm.

Also, the relative positional relationship of proximity sensors 172, 174, 176, and 178 with respect to protruding sections 194 and 196 is shown in FIG. 14 in a case in which screw 128 is screwed into screw hole 136 of holding plates 112 and 114 and a screw hole of upper plate member 120, that is, in a case in which the distance between attachment sections is (B+4×A) mm. As is apparent from the figure, first protruding section 194 is entered into the opening section of detection section 182 of third proximity sensor 176 and the opening section of detection section 182 of fourth proximity sensor 178. By this, an on signal is input into controller 202 from third proximity sensor 176 and fourth proximity sensor 178. Then, controller 202 calculates the distance between attachment sections as (B+4×A) mm from the map data based on the on signals from third proximity sensor 176 and fourth proximity sensor 178.

In this way, with board work device 10, the distance between attachment sections is calculated in a case in which protruding sections 194 and 196 are detected by two sensors out of proximity sensors 172, 174, 176, and 178, that is, in a case in which an on signal is entered from two sensors out of proximity sensors 172, 174, 176, and 178. By this, it is possible to prevent misdetection of the distance between attachment sections in a case in which a problem occurs such as a disconnection or contact defect with a proximity sensor 172, 174, 176, or 178.

Figures 15, 16:
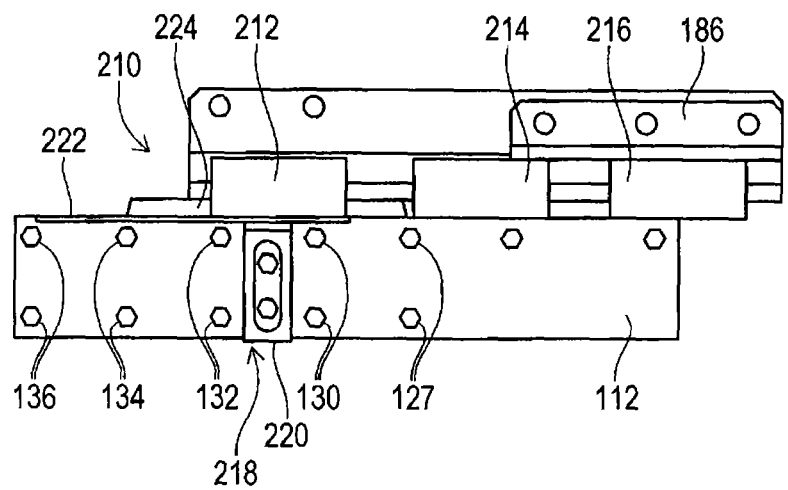
FIG. 15 shows the relative positional relationship of the proximity sensors and the protrusions in a comparative example.
FIG. 16 shows the relationship between the distance between attachment sections and the on signal of the proximity switches in a comparative example.

In detail, in a conventional board work device, a detection device 210 with a configuration shown in FIG. 15 is used. Detection device 210 is configured from three proximity sensors 212, 214, and 216, and detected member 218. Detected member 218 is configured from fixing section 220, extending section 222, and protruding section 224. Fixing section 220 is fixed to holding plate 112. Extending section 222 is fixed to an upper section of fixing section 220 and extends along the upper edge of holding plate 112. Protruding section 224 protrudes upwards from extending section 222. Also, each of proximity sensors 212, 214, and 216 is, in a similar way to proximity sensors 172, 174, 176, and 178 of detection device 170, substantially U-shaped, and is fixed to sensor fixing section 186 such that the U-shaped opening section points downwards. Also, proximity sensors 212, 214, and 216 output an on signal when protruding section 224 enters into the U-shaped opening section.

According to this kind of configuration, the distance between attachment sections is calculated based on the entering into detection device 210 of an on signal from proximity sensors 212, 214, or 216. The detection method of the distance between attachment sections by detection device 210 is described in detail below. Note that, when distinguishing between the three proximity sensors 212, 214, and 216, these are given as, in order from an end of sensor fixing section 186, fifth proximity sensor 212, sixth proximity sensor 214, and seventh proximity sensor 216.

First, as shown in FIG. 15, protruding section 224 is entered into the opening section of fifth proximity sensor 212 in a case in which screw 128 is screwed into screw hole 127 of holding plates 112 and 114 and a screw hole of upper plate member 120, that is, in a case in which the distance between attachment sections is B mm. By this, an on signal is input into controller 202 from fifth proximity sensor 212. Map data corresponding to the table shown in FIG. 16 is stored in controller 202 and controller 202 calculates the distance between attachment sections as B mm from the map data based on the on signal from fifth proximity sensor 212.

Also, protruding section 224 is entered into the opening section of fifth proximity sensor 212 and the opening section of sixth proximity sensor 214 in a case in which screw 128 is screwed into screw hole 130 of holding plates 112 and 114 and a screw hole of upper plate member 120, that is, in a case in which the distance between attachment sections is (B+A) mm. By this, as shown in FIG. 16, an on signal is input into controller 202 from fifth proximity sensor 212 and sixth proximity sensor 214, and controller 202 calculates the distance between attachment sections as (B+A) from the map data.

Also, protruding section 224 is entered into the opening section of sixth proximity sensor 214 in a case in which screw 128 is screwed into screw hole 132 of holding plates 112 and 114 and a screw hole of upper plate member 120, that is, in a case in which the distance between attachment sections is (B+2×A) mm. By this, as shown in FIG. 16, an on signal is input into controller 202 from sixth proximity sensor 214, and controller 202 calculates the distance between attachment sections as (B+2×A) from the map data.

Also, protruding section 224 is entered into the opening section of sixth proximity sensor 214 and the opening section of seventh proximity sensor 216 in a case in which screw 128 is screwed into screw hole 134 of holding plates 112 and 114 and a screw hole of upper plate member 120, that is, in a case in which the distance between attachment sections is (B+3×A) mm. By this, as shown in FIG. 16, an on signal is input into controller 202 from sixth proximity sensor 214 and seventh proximity sensor 216, and controller 202 calculates the distance between attachment sections as (B+3×A) from the map data.

Also, protruding section 224 is entered into the opening section of seventh proximity sensor 216 in a case in which screw 128 is screwed into screw hole 136 of holding plates 112 and 114 and a screw hole of upper plate member 120, that is, in a case in which the distance between attachment sections is (B+4×A) mm. By this, as shown in FIG. 16, an on signal is input into controller 202 from seventh proximity sensor 216, and controller 202 calculates the distance between attachment sections as (B+4×A) from the map data.

In this way, with detection device 210, the distance between attachment sections is calculated in a case in which an on signal is entered from one sensor or two sensors out of proximity sensors 212, 214, and 216. Due to this, for example, there is a possibility that the distance between attachment sections will be misdetected in a case in which a problem such as a disconnection or contact defect occurs with proximity sensor 212, 214, or 216. In detail, for example, in a case in which there is a problem with sixth proximity sensor 214, an on signal is not input into controller 202 from sixth proximity sensor 214. Thus, in a case in which screw 128 is screwed into screw hole 130 of holding plates 112 and 114 and a screw hole of upper plate member 120, that is, in a case in which the distance between attachment sections is (B+A) mm, protruding section 224 is entered into the opening section of fifth proximity sensor 212 and the opening section of sixth proximity sensor 214, but an on signal is only input into controller 202 from sixth proximity sensor 214. Due to this, controller 202 calculates the distance between attachment sections as B mm from the map data based on the on signal from sixth proximity sensor 214. In this way, with detection device 210, there is a possibility of misdetecting the distance between attachment sections.

In contrast, with detection device 170 provided on board work device 10, the distance between attachment sections is calculated in a case in which an on signal is entered from two sensors out of proximity sensors 172, 174, 176, and 178. Thus, for example, there are cases in which an on signal is not entered from two sensors out of proximity sensors 172, 174, 176, and 178 when a problem occurs with proximity sensor 172, 174, 176, or 178. In this case, it is determined which sensor out of proximity sensors 172, 174, 176, and 178 has a problem, and detection of the distance between attachment sections is not performed.

Specifically, for example, in a case in which a problem occurs with second proximity sensor 174, an on signal is not input into controller 202 from second proximity sensor 174. Thus, in a case in which screw 128 is screwed into screw hole 127 of holding plates 112 and 114 and a screw hole of upper plate member 120, that is, in a case in which the distance between attachment sections is B mm, first protruding section 196 is entered into the opening section of first proximity sensor 172 and second protruding section 196 is entered into the opening section of second proximity sensor 174, but an on signal is only input into controller 202 from first proximity sensor 172. As is apparent from FIG. 10, in a case in which an on signal is entered from first proximity sensor 172, the distance between attachment sections is B mm or (B+A) mm, and usually an on signal is input into controller 202 from second proximity sensor 174 or third proximity sensor 176. Thus, controller 202 determines that there is a problem with second proximity sensor 174 or third proximity sensor 176 and does not perform detection of the distance between attachment sections. Also, based on a command from controller 202, a message is displayed on panel device 208 indicating that there is a problem with second proximity sensor 174 or third proximity sensor 176 and that detection of the distance between attachment sections cannot be performed.

In this way, with detection device 170, it is possible to prevent the misdetection of the distance between attachment sections in a case in which there is a problem with a proximity sensor 172, 174, 176, or 178. Also, it is possible to estimate which sensor out of proximity sensors 172, 174, 176, and 178 has the problem.

Also, when the distance between attachment sections is detected by detection device 170, it is determined whether that detected distance between attachment sections is the distance between attachment sections that was expected. Also, in a case in which the distance between attachment sections is different to the distance between attachment sections that was expected, a message is displayed on panel device 208 based on a command from controller 202 indicating that the distance between attachment sections, that is, the attachment location of upper plate member 120 to holding plate 112 is incorrect. By this, it is possible to appropriately perform a check of the attachment location of upper plate member 120.

Further, as shown in FIG. 11 and FIG. 13, with detection device 170, the distance between first protruding section 194 and second protruding section 196 is wider than the detection range of proximity sensors 172, 174, 176, and 178, that is, wider than the width of detection section 182. Thus, protruding sections 194 and 196 are detected by two sensors that are not adjacent to each other out of proximity sensors 172, 174, 176, and 178. Thus, the distance between attachment sections is detected based on an on signal from two sensors that are not adjacent to each other out of proximity sensors 172, 174, 176, and 178. With detection device 170, by detecting the distance between attachment sections based on an on signal from two sensors that are not adjacent to each other out of proximity sensors 172, 174, 176, and 178, not from an on signal from two sensors that are adjacent to each other out of proximity sensors 172, 174, 176, and 178, it is possible to make the quantity of sensors smaller than the quantity of distances between attachment sections to be detected, that is, smaller than the quantity of attachment locations of upper plate member 120.

In detail, for example, the quantity of combinations of two adjacent sensors among multiple proximity sensors is one fewer than the quantity of sensors. For example, with four proximity sensors 172, 174, 176, and 178 of detection device 170, there are three combinations: first proximity sensor 172 and second proximity sensor 174, second proximity sensor 174 and third proximity sensor 176, and third proximity sensor 176 and fourth proximity sensor 178. In other words, to detect five attachment locations of upper plate member 120 using two adjacent sensors out of multiple proximity sensors requires six proximity sensors.

However, with detection device 170, by detecting the distance between attachment sections based on an on signal from two sensors that are not adjacent to each other out of proximity sensors 172, 174, 176, and 178, not from an on signal from two sensors that are adjacent to each other out of proximity sensors 172, 174, 176, and 178, it is possible to detect five attachment locations of upper plate member 120 using four proximity sensors 172, 174, 176, and 178. In this way, with detection device 170, the quantity of sensors provided is reduced, thus costs are reduced.

<Checking Stopper Attachment According to the Distance Between Attachment Sections>

As given above, with board work device 10 it is possible to change the distance between attachment sections such that the movement amount of slider 80 in the X-axis direction is adjusted according to the distance between attachment sections. In detail, five stoppers 166 of a different length are prepared according to the distance between attachment sections, that is, according to the attachment location of upper plate member 120 on holding plates 112 and 114, and as shown in FIG. 3 and FIG. 4, a stopper 166 with a length appropriate to the distance between attachment sections is attached to stopper attachment section 162.

However, because attaching stopper 166 to stopper attachment section 162 is performed by an operator, there are cases in which a stopper 166 of an appropriate length is not attached. In this case, there is a possibility that a work head attached to slider 80 will collide with side wall 160 of board work device 10 thus damaging the work head. Also, there are cases in which the possible movement area of the work head becomes smaller and the work head cannot perform work appropriately.

Specifically, for example, as shown in FIG. 4, in a case in which the distance between attachment sections is (B+4×A) mm, stopper 166b should be attached to stopper attachment section 162. However, there are cases in which stopper 166a (refer to FIG. 3) is attached to stopper attachment section 162 due to an operator mistake or the like. In this case, there is a worry that first attachment section 108 will not contact stopper 166a, and work head 158 attached to second attachment section 110 will collide with side wall 160, thus damaging work head 158. Also, for example, as shown in FIG. 3, in a case in which the distance between attachment sections is B mm, stopper 166a should be attached to stopper attachment section 162. However, there are cases in which stopper 166b (refer to FIG. 4) is attached to stopper attachment section 162 due to an operator mistake or the like. In this case, second mounting head 26 attached to second attachment section 110 cannot come close to side wall 160, thus work cannot be performed close to side wall 160.

In consideration of these issues, with board work device 10, a check is performed as to whether a stopper 166 appropriate for the distance between attachment sections is attached to stopper attachment section 162. Specifically, first, controller 202, according to the method given above, calculates the distance between attachment sections and acquires a movement amount of slider 80 in the X-axis direction according to the distance between attachment sections. Map data in which a distance between attachment sections is linked to a movement amount of slider 80 in the X-axis direction according to the distance between attachment sections is stored in controller 202, and controller 202 acquires the movement amount of slider 80 according to the distance between attachment sections based on the map data.

Continuing, controller 202 transmits a command to electromagnetic motor 82 of moving device 28 to move slider 80 towards a stroke end of the acquired movement amount of slider 80. By this, slider 80 moves towards the stroke end, that is, coordinates in the movement range of slider 80 at the side of an end of stopper 166. Note that, the movement speed of slider 80 is relatively fast when there is no possibility of slider 80 contacting stopper 166, and relatively slow when there is a possibility of slider 80 contacting stopper 166. That is, in a case in which the coordinate of the stroke end in the X-axis direction is $X_1$, and the coordinate in the X-axis direction of an end of stopper 166b, which is attached when the longest stopper 166b out of the five stoppers 166 is attached to stopper attachment section 162, is $X_2$ ($<X_1$), slider 80 moves at a relatively fast speed in a region where the coordinate in the X-axis direction is less than $X_2$, and moves at a relatively slow speed in a region where the coordinate is from $X_2$ to $X_1$. By this, as well as the time required for stopper check work being made smaller, it is possible to reduce the impact when contact is made with stopper 166.

When slider 80 moves towards the stroke end, controller 202 determines whether stopper 166 has contacted first attachment section 108. In detail, if a torque value of electromagnetic motor 82 of moving device 28 exceeds a specified value, it is determined that stopper 166 is contacting first attachment section 108 and movement of slider 80 is being limited. Here, if stopper 166 does not contact first attachment section 108 even though slider 80 has moved to the stroke end, it can be considered that a stopper 166 shorter than a stopper 166 appropriate for the distance between attachment sections is attached to stopper attachment section 162, or that stopper 166 is not attached to stopper attachment section 162. Thus, a message indicating that a stopper is not attached or that an inappropriate stopper is attached is displayed on panel device 208 based on a command from controller 202.

Also, if stopper 166 contacts first attachment section 108 even though slider 80 has not moved to the stroke end, it can be considered that a stopper 166 longer than a stopper 166 appropriate for the distance between attachment sections is attached to stopper attachment section 162. Thus, a message indicating that an inappropriate stopper is attached is displayed on panel device 208 based on a command from controller 202.

Also, if stopper 166 contacts first attachment section 108 at the time slider 80 moves to the stroke end, it can be considered that a stopper 166 appropriate for the distance between attachment sections is attached to stopper attachment section 162. Thus, a message indicating that an appropriate stopper 166 is attached is displayed on panel device 208 based on a command from controller 202.

In this way, with board work device 10, a check is performed as to whether a stopper 166 appropriate for the distance between attachment sections is attached to stopper attachment section 162, and that check result is displayed on panel device 208. By this, it is possible to reliably attach a stopper 166 appropriate for the distance between attachment sections to stopper attachment section 162, to prevent a work head contacting side wall 160, and to maintain an appropriate possible operation range of a work head.

Note that, as shown in FIG. 8, controller 202 has storage section 230, moving control section 232, and determining section 234 as a functional section for checking the attachment of an appropriate stopper 166. Storage section 230 is a functional section that stores a movement amount of slider 80 according to the distance between attachment sections. Moving control section 232 is a functional section that controls operation of slider 80 and moves slider 80 towards the stroke end of a movement amount of slider 80 according to the distance between attachment sections. Determining section 234 is a functional section that determines whether stopper 166 has contacted first attachment section 108 while slider 80 is moving towards the stroke end.

Note that, in the above embodiment, board work device 10 is an example of a work machine. First mounting head 24, second mounting head 26, and work heads 156 and 158, are each an example of a work head. Moving device 28 is an example of a moving device. X-axis direction guide rail 76 is an example of a holding section. Slider 80 is an example of a slider. Holding plates 112 and 114 are each an example of a main body. First attachment section 108 is an example of a first attachment section. Upper plate member 120 is an example of a second attachment section. Stopper 166 is an example of a stopper. Detection device 170 is an example of an attachment section spacing detector. Proximity sensors 172, 174, 176, and 178 are each an example of a sensor. Protruding sections 194 and 196 are each an example of a detected section. Control device 200 is an example of a control device. Panel device 208 is an example of a notifying device. Storage section 230 is an example of a storage section. Moving control device 232 is an example of a moving control section. Determining section 234 is an example of a determining section.

Further, the present disclosure is not limited to the above example embodiment, and various changed or improved methods of embodiment are possible based on the knowledge of someone skilled in the art. Specifically, for example, in the embodiment, a mounting head is used as a work head attached to slider 80, however, various work heads such as a dispenser head, an inspection head, or a processing head that performs specified processing with respect to a work target piece may be used. Also, not only one work may be performed by one work head, but one work may be performed by two work heads. Specifically, for example, it is possible for one of two work heads to press a work target piece while the other work head performs work on the pressed work target piece.

Also, the above embodiment applies to a device for performing mounting work onto a circuit board, but the technology of the present disclosure may be applied to a device that performs various work for a circuit board. In detail, for example, the technology of the present disclosure may be applied to a device for applying cream solder or the like to a circuit board, a device for spraying adhesive or the like to a circuit board, a device for performing various processing for a circuit board, and the like. Also, the technology of the present disclosure may be applied not just work for a circuit board, but may be applied to a device for performing work for various work target pieces or the like.

Also, in the above embodiment, proximity sensors 172, 174, 176, and 178 are used as a sensor for detecting a detected section, but sensors with various configurations may be used. Specifically, for example, a mechanical type sensor that detects contact of a detected section, or a capacitance type sensor that detects the presence of a detected section, or the like may be used.

REFERENCE SIGNS LIST

10: board work device (work machine); 24: mounting head (work head); 26: mounting head (work head); 28: moving device; 76: X-axis direction guide rail (holding section); 80: slider; 112: holding plate (main body); 114: holding plate (main body); 108: first attachment section; 120: upper plate member (second attachment section); 156: work head; 158: work head; 166: stopper; 170: detection device (attachment section spacing detector); 172: proximity sensor; 174: proximity sensor; 176: proximity sensor; 178: proximity sensor; 194: protruding section; 196: protruding section; 200: control device; 208: panel device (notifying device); 230: storage section; 232: moving control section; 234: determining

The invention claimed is:

1. A work machine comprising:
  a slider that is held on a holding section so as to be movable in a specified direction; and
  two work heads that are detachably attached to the slider;
  wherein the slider has
    a main body,
    a first attachment section that is provided on the main body and to which one of the two work heads is attached, and
    a second attachment section that is provided on the main body at a set distance from the first attachment section so as to be changeable between any one of multiple of the set distances that are set in advance, and to which the other of the two work heads is attached, and wherein the work machine further comprises:
multiple detected sections provided on one of the main body and the second attachment section; and
an attachment section spacing distance detector that is provided on the other one of the main body and the second attachment section, has multiple sensors which detect the multiple detected sections, and detects the distance between the first attachment section and the second attachment section by the detection of at least one of the multiple detected sections by two of the sensors out of the multiple sensors.

2. The work machine according to claim 1, wherein the quantity of the multiple sensors is smaller than the quantity of the multiple set distances.

3. The work machine according to claim 1, wherein
the multiple detected sections are provided on one of the main body and the second attachment section spaced at a distance extending in the specified direction;
the multiple sensors are provided on the other one of the main body and the second attachment section spaced at a distance extending in the specified direction;
and the attachment section spacing distance detector detects the distance between the first attachment section and the second attachment section by the detection of the multiple detected sections by two sensors which are not adjacent to each other among the multiple sensors, or by the detection of at least one of the multiple detected sections by two sensors which are adjacent to each other among the multiple sensors.

4. The work machine according to claim 1, further comprising:
a moving device that moves the slider in the specified direction;
a control device that controls operation of the moving device;
a stopper that limits the movement of the slider in the specified direction by being contacted by the stopper;
wherein the stopper changes the movement amount of the slider in the specified direction based on the distance between the first attachment section and the second attachment section;
and wherein the control device has
a storage section that stores the movement amount of the slider in the specified direction based on the distance between the first attachment section and the second attachment section,
a movement control section that acquires from the storage section the movement amount of the slider based on the distance between the first attachment section and the second attachment section that was detected by the attachment section spacing distance detector, and moves the slider towards the stroke end of the acquired movement amount of the slider, and
a determination section that determines whether the slider has contacted the stopper during movement of the slider by the movement control section.

5. The work machine according to claim 1, further comprising:
a notifying device that notifies an operator in a case in which the distance between the first attachment section and the second attachment section detected by the attachment section spacing distance detector is different from a planned distance between the first attachment section and the second attachment section.

6. The work machine according to claim 1, wherein the multiple set distances are set based on at least a dimension of each of the two work heads, and a dimension of a work target piece of each of the two work heads.

* * * * *